United States Patent
Cheng

(10) Patent No.: US 11,930,597 B2
(45) Date of Patent: Mar. 12, 2024

(54) DISPLAY PANEL AND DISPLAY DEVICE HAVING SAME

(71) Applicant: TCL CHINA STAR OPTOELECTRONICS TECHNOLOGY CO., LTD., Shenzhen (CN)

(72) Inventor: Peishan Cheng, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 336 days.

(21) Appl. No.: 17/055,518

(22) PCT Filed: Aug. 5, 2020

(86) PCT No.: PCT/CN2020/107068
§ 371 (c)(1),
(2) Date: Nov. 13, 2020

(87) PCT Pub. No.: WO2022/007082
PCT Pub. Date: Jan. 13, 2022

(65) Prior Publication Data
US 2022/0225505 A1    Jul. 14, 2022

(30) Foreign Application Priority Data
Jul. 10, 2020    (CN) .......................... 202010663723.5

(51) Int. Cl.
*H05K 1/18*    (2006.01)
*H05K 1/14*    (2006.01)

(52) U.S. Cl.
CPC ..... *H05K 1/14* (2013.01); *H05K 2201/10128* (2013.01)

(58) Field of Classification Search
CPC ................... H05K 1/14; H05K 2201/10128
(Continued)

(56) References Cited

U.S. PATENT DOCUMENTS

| 8,379,011 B2 * | 2/2013 | Bae ...................... G09G 3/3696 345/212 |
| 2004/0070721 A1 | 4/2004 | Tsubokura et al. |

(Continued)

FOREIGN PATENT DOCUMENTS

| CN | 1892322 A | 1/2007 |
| CN | 101719606 A | 6/2010 |

(Continued)

OTHER PUBLICATIONS

International Search Report in International application No. PCT/CN2020/107068, dated Mar. 29, 2021.
(Continued)

*Primary Examiner* — Binh B Tran
(74) *Attorney, Agent, or Firm* — PV IP PC; Wei Te Chung; Zhigang Ma

(57) ABSTRACT

A display panel and a display device are disclosed. By disposing a binding film over a gap between adjacent circuit boards, and then forming connection wires on the binding film, connections between different circuit boards are achieved. The present disclosure solves a problem of high costs caused by traditional flexible circuit boards and connectors, thereby saving a large number of connectors and flexible circuit boards, and thereby reducing costs significantly.

12 Claims, 4 Drawing Sheets

(58) Field of Classification Search
USPC .......................................................... 361/784
See application file for complete search history.

(56) References Cited

U.S. PATENT DOCUMENTS

| | | | |
|---|---|---|---|
| 2005/0190334 A1 | 9/2005 | Tsubokura et al. | |
| 2006/0139291 A1* | 6/2006 | Cho ..................... | G09G 3/3688 345/100 |
| 2009/0253333 A1* | 10/2009 | Lee ........................ | H05K 1/142 445/24 |
| 2014/0078190 A1* | 3/2014 | Wu .......................... | H05K 3/36 29/831 |
| 2015/0091434 A1* | 4/2015 | Kim ..................... | H10K 77/111 313/504 |

FOREIGN PATENT DOCUMENTS

| | | |
|---|---|---|
| CN | 103220876 A | 7/2013 |
| CN | 103293808 A | 9/2013 |
| CN | 103366666 A | 10/2013 |
| CN | 105518765 A | 4/2016 |
| CN | 208126060 U | 11/2018 |
| CN | 110072329 A | 7/2019 |
| CN | 110288936 A | 9/2019 |
| CN | 110767089 A | 2/2020 |
| CN | 110930884 A | 3/2020 |

OTHER PUBLICATIONS

Written Opinion of the International Search Authority in international application No. PCT/CN2020/107068, dated Mar. 29, 2021.

* cited by examiner

DISPLAY PANEL AND DISPLAY DEVICE HAVING SAME

This application is a Notional Phase of PCT Patent Application No. PCT/CN2020/107068 having international filing date of Aug. 5, 2020, which claims priority to Chinese Patent Application No. 202010663723.5 filed on Jul. 10, 2020, the entire contents of which are incorporated by reference in this application.

FIELD OF INVENTION

The present disclosure relates to display technology, and especially relates to a display panel and a display device having same.

BACKGROUND OF INVENTION

As shown in FIG. 1a, in conventional large-size displays or high resolution displays, to prevent a circuit board bound to a binding area by a chip-on-film (COF) film from being excessively long and thus warping at both ends, the circuit board 11 on the binding area is generally divided into two circuit board sections. The two circuit board sections are then electrically connected. The electrical connections are mainly achieved by a flexible circuit board 12 and by connectors.

Technical Problem

As shown in FIG. 1b. In prior arts, in order to cut costs, a control unit 13 is directly disposed on one of the circuit board sections. However, means for establishing connections between the circuit board sections are inconvenient. In addition, as shown in FIG. 1c, in a curving process for manufacturing curved displays, to prevent display flaws caused by damage to the circuit board and the COF film, the circuit board is divided into a plurality of circuit board sections 14. Electrical connections and signal transmissions are then achieved between the plurality of circuit board sections 14. A process of connections is inconvenient and cumbersome. The connections need to be made by using multiple connectors and the flexible circuit boards 12. Moreover, the manufacturing costs of this design are too high.

Therefore, it is necessary to provide a display panel and a display device having same to cut costs.

SUMMARY OF INVENTION

Solution to the Problem

Technical Solution

An object of the present disclosure is to provide a display panel to cut costs of manufacturing the display panel.

The present disclosure provides a display panel, comprising: a display area and a binding area; wherein in the binding area, the display panel comprises a plurality of COF films, wherein one end of the COF film is connected to the display area, and the other end of the COF film is connected to a circuit board; wherein the circuit board comprises at least one gap; and wherein the display panel is provided with a binding film at the gap, the binding film connects the circuit boards which are on both sides of the gap.

Further, the circuit boards include: a first circuit board, disposed at one side of the gap; and a second circuit board, disposed at the other side of the gap.

Further, a shape of the binding film is a rectangular shape; one end of the binding film is bound to an end of the first circuit board which is close to the gap; and the other end of the binding film is bound to an end of the second circuit board which is close to the gap.

Further, the circuit board is connected to a control unit.

Further, the second circuit board is integrated with a control module.

Further, the second circuit board comprises a projection disposed on a side of the second circuit board which is away from the display area; and wherein the control module is disposed on the projection.

Further, the shape of the binding film is a shape of a letter L; one end of the binding film is bound to a side of the first circuit board which is away from the display area; and the other end of the binding film is bound to the end of the second circuit board which is close to the gap.

Further, the first circuit board comprises a first projection disposed at the end of the first circuit board which is close to the gap; the second circuit board comprises a second projection disposed at the end of the second circuit board which is close to the gap.

Further, one end of the binding film is bound to the first circuit board and to the first projection; the other end of the binding film is bound to the second circuit board and to the second projection.

The present disclosure also provides a display device, comprising the said display panel.

Beneficial Effects

The beneficial effects of the present disclosure are: the present disclosure provides a display panel. By disposing the binding film over the gap between the adjacent circuit boards, and then forming connection wires on the binding film, the connections between the different circuit boards are achieved. The present disclosure solves a problem of high costs caused by traditional flexible circuit boards and connectors, thereby saving a large number of connectors and flexible circuit boards, and thereby significantly reducing costs.

DESCRIPTION OF DRAWINGS

Brief Description of Drawings

In order to clearly illustrate the embodiments of the present disclosure, the following briefly introduces the accompanying drawings used in the embodiments. Obviously, the drawings in the following description merely show some of the embodiments of the present disclosure. As regards one of ordinary skill in the art, other drawings may be obtained in accordance with these accompanying drawings without making creative efforts.

Figure 1A:
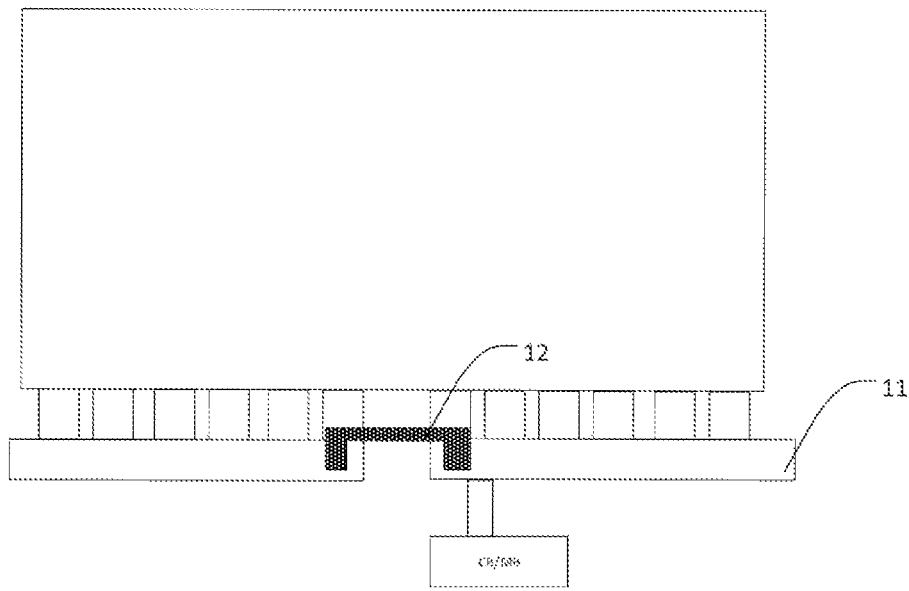
Figure 1B:
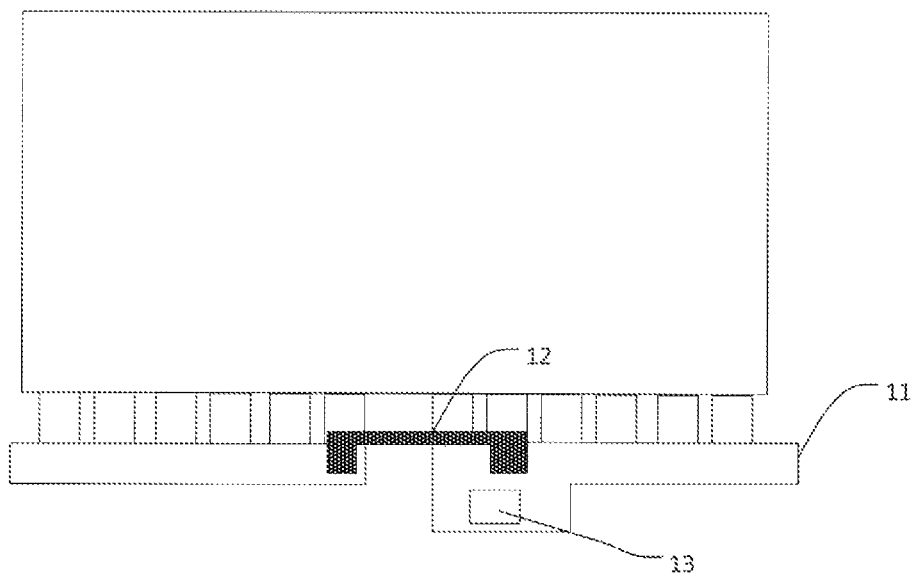
Figure 1C:
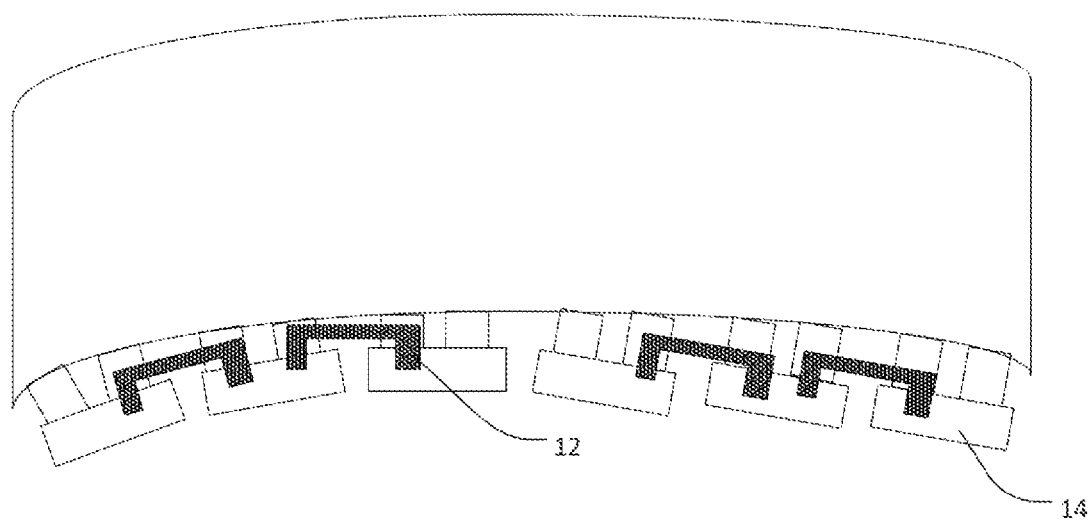
Figure 2:
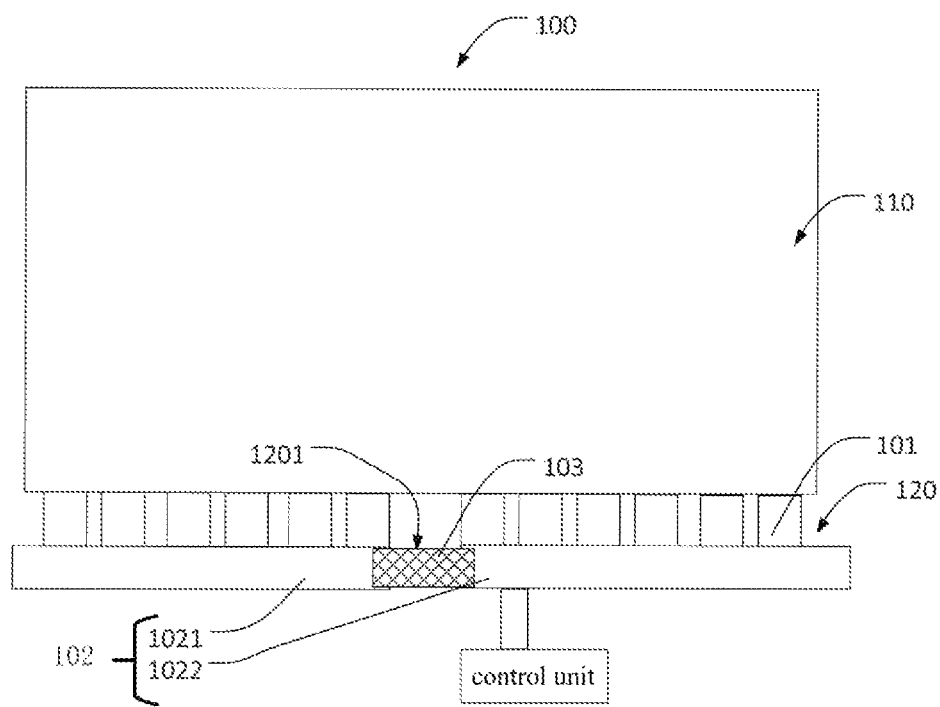
Figure 3:
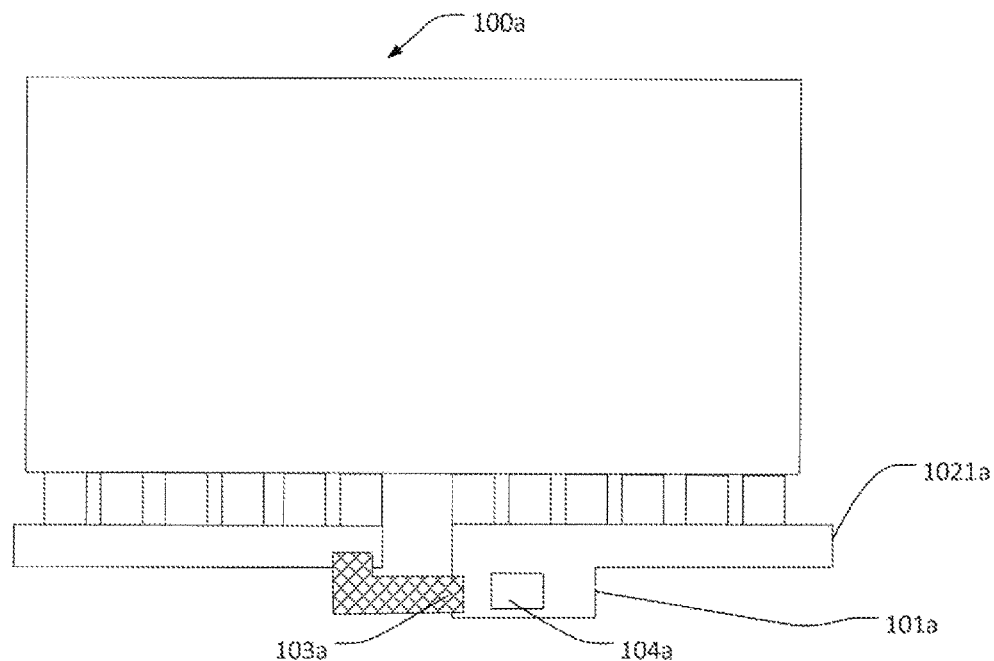
Figure 4:
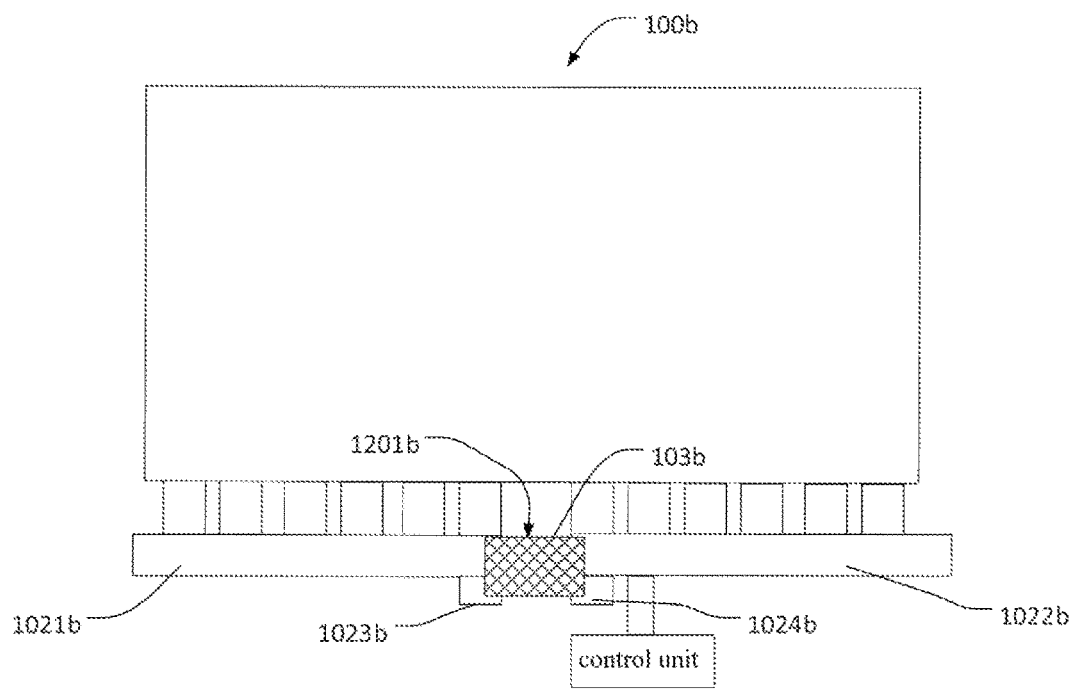
Figure 5:
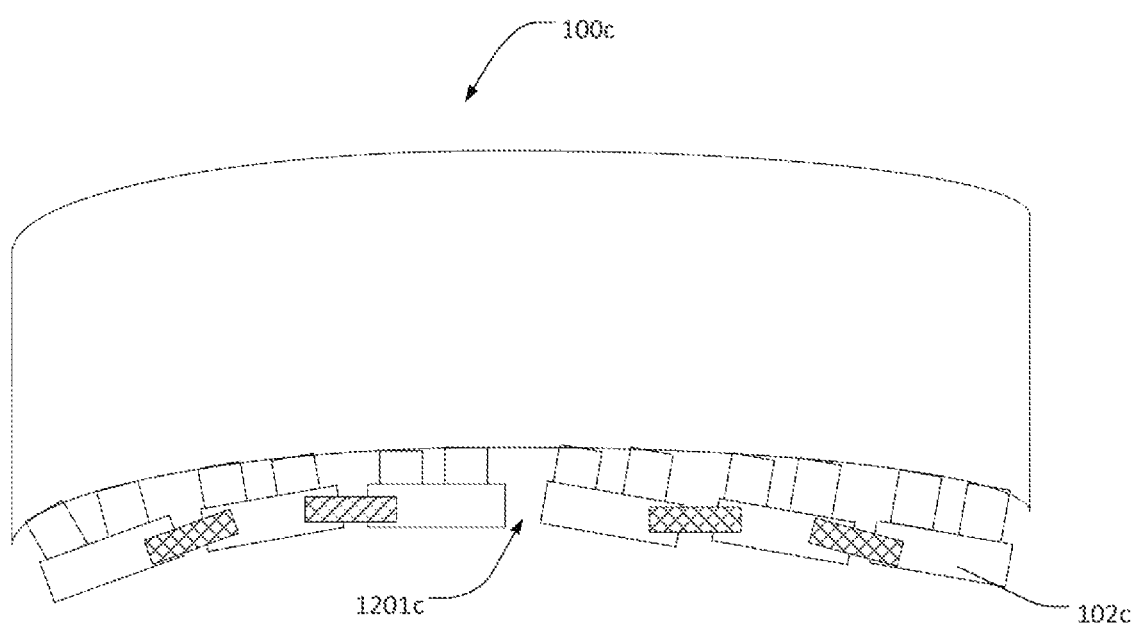

FIG. 1a is a schematic plan view of a display panel according to prior arts;

FIG. 1b is a schematic plan view of another display panel according to prior arts;

FIG. 1c is a schematic plan view of a curved display panel according to prior arts;

FIG. 2 is a schematic plan view of a display panel according to embodiment 1 of the present disclosure;

FIG. 3 is a schematic plan view of a display panel according to embodiment 2 of the present disclosure;

FIG. 4 is a schematic plan view of a display panel according to embodiment 3 of the present disclosure; and FIG. 5 is a schematic plan view of a display panel according to embodiment 4 of the present disclosure.

Reference numbers of elements presented in the drawings are as follows:
display panel 100;
display area 110; binding area 120; COF film 101;
circuit board 102; first circuit board 1021; second circuit board 1022;
gap 1201; binding film 103.

DETAILED DESCRIPTION OF PREFERRED EMBODIMENTS

Embodiments of the Present Disclosure

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. The component numerals mentioned in the present disclosure, such as first, second, etc., are only used for distinguishing different components and for enabling the difference between the components to be better expressed. In the drawings, components with similar structure are indicated by the same reference numeral.

The embodiments of the present disclosure will be described in detail with references to the accompanying drawings. It is to be understood that the present disclosure may be expressed in various forms and is not limited in its application to the specific embodiments described in the present disclosure. The object of providing embodiments in the present disclosure is to explain the applications of the present disclosure, thereby enabling one skill in the art to understand the various embodiments of the present disclosure and various modifications that is respectively suitable for specific expected application.

As shown in FIG. 2, an embodiment 1 of the present disclosure provides a display panel 100, comprising a display area 110 and a binding area 120.

Wherein in the binding area 120, the display panel 100 comprises a plurality of COF films 101, wherein one end of the COF film 101 is connected to the display area 110, and the other end of the COF film 101 is connected to a circuit board 102.

Wherein, the circuit board 102 comprises at least one gap 1201.

Wherein, the display panel 100 is provided with a binding film 103 at the gap 1201, the binding film 103 connects two parts of the circuit boards 102 which are on both sides of the gap 1201.

The gap 1201 divides the circuit board 102 into a first circuit board 1021 and a second circuit board 1022.

The first circuit board 1021 is disposed on one side of the gap 1201 while the second circuit board 1022 is disposed on the other side of the gap 1201. In FIG. 2, the first circuit board 1021 is disposed on a left side of the gap 1201 while the second circuit board 1022 is disposed on a right side of the gap 1201.

A shape of the binding film 103 is a rectangular shape.

One end of the binding film 103 is bound to an end of the first circuit board 1021 which is close to the gap 1201 and the other end of the binding film 103 is bound to an end of the second circuit board 1022 which is close to the gap 1201.

The circuit board 102 is connected to a control unit.

As shown in FIG. 3, an embodiment 2 of the present disclosure provides a display panel 100a. The embodiment 2 differs from the embodiment 1 in that in the embodiment 2, a second circuit board 1022a is integrated with a control module.

Specifically, the second circuit board 1022a comprises a projection 101a which is disposed on a side of the second circuit board 1022a which is away from a display area 110a. The projection 101a is disposed at the end of the second circuit board 1022a which is close to a gap 1201a.

The control module is disposed on the projection 101a.

A shape of a binding film 103a is a shape of a letter L.

One end of the binding film 103a is bound to a side of a first circuit board 1021a which is away from the display area 110a while the other end of the binding film 103a is bound to the end of the second circuit board 1022a which is close to the gap 1201a.

As shown in FIG. 4, an embodiment 3 of the present disclosure provides a display panel 100b. The embodiment 3 differs from the embodiment 1 in that in the embodiment 3, a first circuit board 1021b comprises a first projection 1023b which is disposed at an end of the first circuit board 1021b which is close to a gap 1201b.

A second circuit board 1022b comprises a second projection 1024b which is disposed at an end of the second circuit board 1022b which is close to the gap 1201b.

One end of a binding film 103b is bound to the first circuit board 1021b and to the first projection 1023b, forming a first binding area. The other end of the binding film 103b is bound to the second circuit board 1022b and to the second projection 1024b, forming a second binding area.

In actual application, a width of the binding area is greater than a width of the circuit boards. That is, a width of the first binding area is greater than a width of the first circuit board 1021b, and a width of the second binding area is greater than a width of the second circuit board 1022b.

As shown in FIG. 5, an embodiment 4 of the present disclosure provides a display panel 100c. The embodiment 4 differs from the embodiment 1 in that in the embodiment 4, gaps 1201c are dense, and the display panel 100c is suitable for curved structure.

By forming a plurality of gaps 1201c, thereby dividing the circuit board into a plurality of circuit board subunits 102c and by connecting the circuit board subunits 102c through binding films 103c, a tension generated upon curving the circuit board may be reduced, and the display panel 100c may be effectively protected.

A display panel 100 is provided by the present disclosure. In the display panel 100, by disposing the binding film 103 over the gap 1201 between the adjacent circuit boards 102, and then forming connection wires on the binding film 103, connections between the different circuit boards 102 are achieved. The display panel 100 solves a problem of high costs caused by traditional flexible circuit boards and connectors, thereby saving a large number of connectors and flexible circuit boards, and thereby significantly reducing costs.

The present disclosure also provides a display device, comprising a display panel.

Wherein the display panel is a display panel described in any of the embodiments 1 to 4.

In the display panel, by disposing the binding film 103 over the gap 1201 between the adjacent circuit boards 102, and then forming the connection wires on the binding film 103, the connections between the different circuit boards 102 are achieved. The display panel solves the problem of high costs caused by the traditional flexible circuit boards and connectors, thereby saving a large number of connectors and flexible circuit boards, and thereby significantly reducing costs.

The scope of the present disclosure is in no way restricted to what has been set forth in the present disclosure. It is evident that many modifications and variations will be apparent to those skilled in the art. Accordingly, it is intended to embrace all such modifications and variations that fall within the spirit and broad scope of the appended claims.

What is claimed is:

1. A display panel, comprising: a display area and a binding area disposed at a side of the display area;
    wherein in the binding area, the display panel comprises a plurality of COF films and a plurality of circuit boards disposed at one side of the display area, one end of each of the COF films is connected to the display panel, and another end of each of the COF films is connected to a corresponding one of the circuit boards;
    wherein the circuit boards comprise a first circuit board and a second circuit board, and a gap is disposed between the first circuit board and the second circuit board; the first circuit board comprises a first main body and a first projection, and the first projection is disposed adjacent to an end of the first main body adjacent to the gap and is disposed at a side of the first main body away from the display area; and the second circuit board comprises a second main body and a second projection, and the second projection is disposed adjacent to an end of the second main body adjacent to the gap and is disposed at a side of the second projection away from the display area; and
    wherein the display panel is further provided with a binding film covering the gap, one end of the binding film is bound to a first binding area defined on the first main body and the first projection, and a width of the first binding area is greater than a width of the first main body; and another end of the binding film is bound to a second binding area defined on the second main body and the second projection, and a width of the second binding area is greater than a width of the second main body.

2. The display panel as claimed in claim 1, wherein a shape of the binding film is a rectangular shape.

3. The display panel as claimed in claim 1, wherein the circuit boards are connected to a control unit.

4. The display panel as claimed in claim 1, wherein the second circuit board is integrated with a control module.

5. The display panel as claimed in claim 4, wherein the control module is disposed on the projection.

6. The display panel as claimed in claim 1, wherein a shape of the binding film is a shape of a straight line.

7. A display device comprising a display panel, wherein the display panel comprises a display area and a binding area disposed at a side of the display area;
    wherein in the binding area, the display panel comprises a plurality of COF films and a plurality of circuit boards disposed at one side of the display area, one end of each of the COF films is connected to the display panel, and another end of each of the COF films is connected to a corresponding one of the circuit boards;
    wherein the circuit boards comprise a first circuit board and a second circuit board, and a gap is disposed between the first circuit board and the second circuit board; the first circuit board comprises a first main body and a first projection, and the first projection is disposed adjacent to an end of the first main body adjacent to the gap and is disposed at a side of the first main body away from the display area; and the second circuit board comprises a second main body and a second projection, and the second projection is disposed adjacent to an end of the second main body adjacent to the gap and is disposed at a side of the second projection away from the display area;
    wherein the display panel is further provided with a binding film covering the gap, one end of the binding film is bound to a first binding area defined on the first main body and the first projection, and a width of the first binding area is greater than a width of the first main body; and
    another end of the binding film is bound to a second binding area defined on the second main body and the second projection, and a width of the second binding area is greater than a width of the second main body.

8. The display device as claimed in claim 7, wherein a shape of the binding film is a rectangular shape.

9. The display device as claimed in claim 7, wherein the circuit boards are connected to a control unit.

10. The display device as claimed in claim 7, wherein the second circuit board is integrated with a control module.

11. The display device as claimed in claim 10, wherein the control module is disposed on the projection.

12. The display device as claimed in claim 7, wherein a shape of the binding film is a shape of a straight line.

* * * * *